(12) United States Patent
Nowak et al.

(10) Patent No.: US 8,719,610 B2
(45) Date of Patent: May 6, 2014

(54) LOW POWER ELECTRONIC SYSTEM ARCHITECTURE USING NON-VOLATILE MAGNETIC MEMORY

(75) Inventors: Matthew Michael Nowak, San Diego, CA (US); Lew Chua-Eoan, Carlsbad, CA (US); Seung H Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 633 days.

(21) Appl. No.: 12/235,933

(22) Filed: Sep. 23, 2008

(65) Prior Publication Data

US 2010/0077244 A1 Mar. 25, 2010

(51) Int. Cl.
*G06F 1/00* (2006.01)

(52) U.S. Cl.
USPC ............. 713/324; 713/2; 713/300; 713/320; 365/158; 365/173; 438/48

(58) Field of Classification Search
USPC ..................................... 713/2, 300, 320, 324
See application file for complete search history.

(56) References Cited

U.S. PATENT DOCUMENTS

| | | | |
|---|---|---|---|
| 6,421,782 B1 * | 7/2002 | Yanagisawa et al. | 726/4 |
| 6,438,668 B1 | 8/2002 | Esfahani et al. | |
| 6,449,683 B1 * | 9/2002 | Silvester | 711/103 |
| 6,747,318 B1 | 6/2004 | Kapre et al. | |
| 6,747,328 B2 | 6/2004 | Wu | |
| 6,914,845 B2 * | 7/2005 | Ooishi | 365/229 |
| 6,947,318 B1 * | 9/2005 | Fujita | 365/173 |
| 7,262,069 B2 * | 8/2007 | Chung et al. | 438/48 |
| 7,264,985 B2 * | 9/2007 | Chung et al. | 438/48 |
| 7,313,684 B2 * | 12/2007 | O'Connell | 713/2 |
| 7,369,815 B2 * | 5/2008 | Kang et al. | 455/73 |
| 7,379,327 B2 * | 5/2008 | Chen et al. | 365/158 |
| 7,494,846 B2 * | 2/2009 | Hsu et al. | 438/109 |
| 7,550,789 B2 * | 6/2009 | Bonaccio et al. | 257/209 |
| 7,792,066 B2 * | 9/2010 | Fujii et al. | 370/311 |
| 7,872,936 B2 * | 1/2011 | Blankenship | 365/230.03 |
| 8,114,345 B2 * | 2/2012 | Dlugos et al. | 422/22 |
| 2003/0051104 A1 | 3/2003 | Riedel | |
| 2003/0133337 A1 * | 7/2003 | Yamada et al. | 365/200 |
| 2004/0066669 A1 * | 4/2004 | Ooishi | 365/173 |
| 2005/0064829 A1 * | 3/2005 | Kang et al. | 455/127.1 |
| 2005/0184399 A1 | 8/2005 | Damberg et al. | |

(Continued)

FOREIGN PATENT DOCUMENTS

| | | |
|---|---|---|
| CN | 1529910 A | 9/2004 |
| CN | 1799028 A | 7/2006 |

(Continued)

OTHER PUBLICATIONS

"Introduction to High-Density Through Silicon Stacking Technology"—Matthew Nowak; 25 pages, dated May 13, 2011.*

(Continued)

*Primary Examiner* — Brian Misiura
(74) *Attorney, Agent, or Firm* — Michelle S. Gallardo

(57) ABSTRACT

A computing system includes at least one functional unit and a magnetic random access memory (MRAM) block coupled to the at least one functional unit. The MRAM block is configured to store a functional state of the at least one functional unit during a power down state of the at least one functional unit.

20 Claims, 5 Drawing Sheets

(56) References Cited

U.S. PATENT DOCUMENTS

| | | | |
|---|---|---|---|
| 2006/0242398 A1* | 10/2006 | Fontijn et al. ............... | 713/2 |
| 2008/0059785 A1 | 3/2008 | O'connell | |
| 2008/0071972 A1 | 3/2008 | Kimura | |
| 2008/0137399 A1* | 6/2008 | Chan et al. ............... | 365/158 |
| 2010/0017637 A1* | 1/2010 | Rosay ............... | 713/323 |
| 2010/0151919 A1* | 6/2010 | Caskey ............... | 455/574 |
| 2013/0044538 A1* | 2/2013 | Oh et al. ............... | 365/158 |

FOREIGN PATENT DOCUMENTS

| | | |
|---|---|---|
| CN | 101000918 A | 7/2007 |
| JP | 2003115578 A | 4/2003 |
| JP | 2004362426 A | 12/2004 |
| JP | 2008198311 A | 8/2008 |
| JP | 2008210358 A | 9/2008 |
| WO | WO2004107168 A1 | 12/2004 |
| WO | WO2006080908 A1 | 8/2006 |
| WO | WO2008108264 A1 | 9/2008 |

OTHER PUBLICATIONS

International Search Report—PCT/US2009/057458—International Search Authority—European Patent Office, Dec. 23, 2009.
Taiwan Search Report—TW098132140—TIPO—Apr. 26, 2013.

* cited by examiner

LOW POWER ELECTRONIC SYSTEM ARCHITECTURE USING NON-VOLATILE MAGNETIC MEMORY

CROSS-REFERENCE TO RELATED APPLICATIONS

This application is related to commonly-assigned, co-pending, patent application Ser. No. 12/328,042 entitled, "NON-VOLATILE STATE RETENTION LATCH," the disclosure of which is expressly incorporated herein by reference.

TECHNICAL FIELD

The present disclosure is related, in general, to electronic circuit architecture and, more particularly to a low power system architecture using non-volatile magnetic memory.

BACKGROUND

In today's electronics-driven world, power is the key to keeping society in motion. However, with the increasing costs of power and, in handheld devices, the demand for increased battery life, the issue of power consumption in electronic devices has become of paramount importance. When computers lay idle for a period of time, many enter a power-collapsed state or standby state, in which power consumption is dramatically reduced. Handheld devices, such as mobile phones, when not in use, typically also enter a power-collapsed state, in which the power or battery is disconnected from many parts of the operating circuitry. Electronic components themselves have also been developed with lower power requirements. Taken as a whole, a considerable amount of technology has been developed for conserving power. While power consumption has been considerably reduced using these technologies, electronics designers are still generally limited by the power requirements of memory, and, in particular, the power requirements of memory to save state.

Modern electronics are typically designed to "wake up," i.e., reestablish power when exiting from a standby state, without having lost any of the operational information in memory when the electronic device collapsed into the standby state. For example, a user who answers the phone in the middle of writing a letter in a word processor might leave the computer long enough for the computer to enter the standby mode. When the user comes back, he or she may wake the computer up and immediately continue writing the letter from the point at which he/she left off. Similarly, when a user reaches for his or her phone to make a call, the phone typically wakes up from its standby state (if the user was not currently using the phone), ready to receive dialing and make the call. Also, if a user is playing video using a digital signal processor (DSP) of a mobile device and a call arrives, causing the DSP to power collapse, the user should be able to return to the same video playback state after the call is completed or ignored. The user is not required to cold start the devices and reload the information from a disk drive or other external non-volatile memory storage in either of these examples. In order to accomplish this instant-on functionality, the information or application state is generally preserved even though the electronics have had power substantially reduced. The power is only moderately reduced because power is generally needed to preserve the information in the memory. While other components may be completely shut down or removed from the power supply, there is a certain amount of power that is usually always-on in order to keep the memory blocks from losing the information that is held.

Many electronic systems utilize static random access memory (SRAM) and dynamic random access memory (DRAM) because of their speed and density. However, SRAM and DRAM are both volatile memories, meaning they lose their information when power is removed. Thus, in order to maintain the state of SRAM and DRAM memories, power is maintained. One method for overcoming this always-on power state has been to incorporate flash memory into the electronic system. Flash memory is a non-volatile memory technology that will maintain its information when the power is removed. However, flash memory is generally too slow to replace SRAM and DRAM memories, so it is often used as an external storage point to store state information.

FIG. 1 is a block diagram illustrating an electronic system 10 featuring a typical memory configuration using a flash non-volatile memory 106. The system 10 is illustrated with an internal section 100 and an external section 101. The external section 101 is generally connected to the internal section 100 within the device. The illustrated components of the system 10 are connected via a bus 102. The SRAM memory block 103 provides local memory for the logic block 104 which includes various combinational logic components and latches using a system clock. A DRAM memory block 105 is provided in the external section 101 for local, yet external to the processing core of internal section 100, higher-volume random access storage for the system 10. The system 10 also includes a flash non-volatile memory (NVM) 106.

For purposes of the example illustrated in FIG. 1, the system 10 will be described as a system for use in a mobile phone. When the mobile phone of system 10 enters into the standby mode, all of the state information currently stored in the SRAM 103 and/or logic 104 is moved to the DRAM 105 on the same package. In one embodiment, the state information could be stored off chip into the flash NVM 106 from the DRAM 105. In this case the state information is encrypted incurring additional time and energy.

Thus, power from the battery of the mobile phone is used to scan the SRAM 103 and logic 104 for state information, and move that state information into the DRAM 105 over the bus 102. Additional power is used to then move the state information from the DRAM 105 over the bus 102 into the flash NVM 106. Conventionally, the amount of power consumed by transmission of data over a bus is a function of the length of the bus. Thus, a considerable amount of power is being drained from the battery to move all of the state information. Moreover, because flash memory is much slower to write than SRAM and DRAM memories, this process takes a considerable amount of time, relative to mobile phone functionality. This is not the only power and time usage during standby processing. When the mobile phone of the system 10 powers back up, power is drained from the battery again to re-install the state information back from the flash NVM 106 to the DRAM 105 (if the NVM 106 is actually used), and to the SRAM 103 and logic 104 from the DRAM 105. Thus, while the standby mode of the system 10 may consume less power because power is no longer used to maintain state in either the SRAM 103 or logic 104, a considerable amount of power is used transferring the state information to and from the DRAM 105 and possibly the flash NVM 106, in addition to the considerable time used in transferring that information back and forth.

SUMMARY

Representative embodiments of the present disclosure relate to computing systems including at least one functional unit and a magnetoresistive random access memory (MRAM) block coupled to the at least one functional unit. The MRAM block is configured to store a functional state of the functional unit during a power down state of the functional unit.

Additional representative embodiments of the present disclosure relate to methods including receiving a standby signal requesting one or more functional units of a computing system to enter a standby state, storing, responsive to receiving the standby signal, at least a portion of a current operational state of the functional units in a magnetic random access memory (MRAM) coupled to the functional units, and removing power from a power supply to the functional units after the current operational state is stored.

Further representative embodiments of the present disclosure relate to systems that include means for receiving a standby signal requesting one or more functional units of a computing system to enter a standby state, means, responsive to the standby signal, for storing at least a portion of a current operational state of the functional units in a magnetic random access memory (MRAM) coupled thereto, and means for removing power from the functional units after the current operational state is stored. The systems further include means for receiving a wake-up signal requesting the one or more functional units in the standby mode to enter an operating mode, means, responsive to the wake-up signal, for restoring the power to the functional units in the standby mode, and means for reinstating the current operational state to the functional units.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Figure 2:
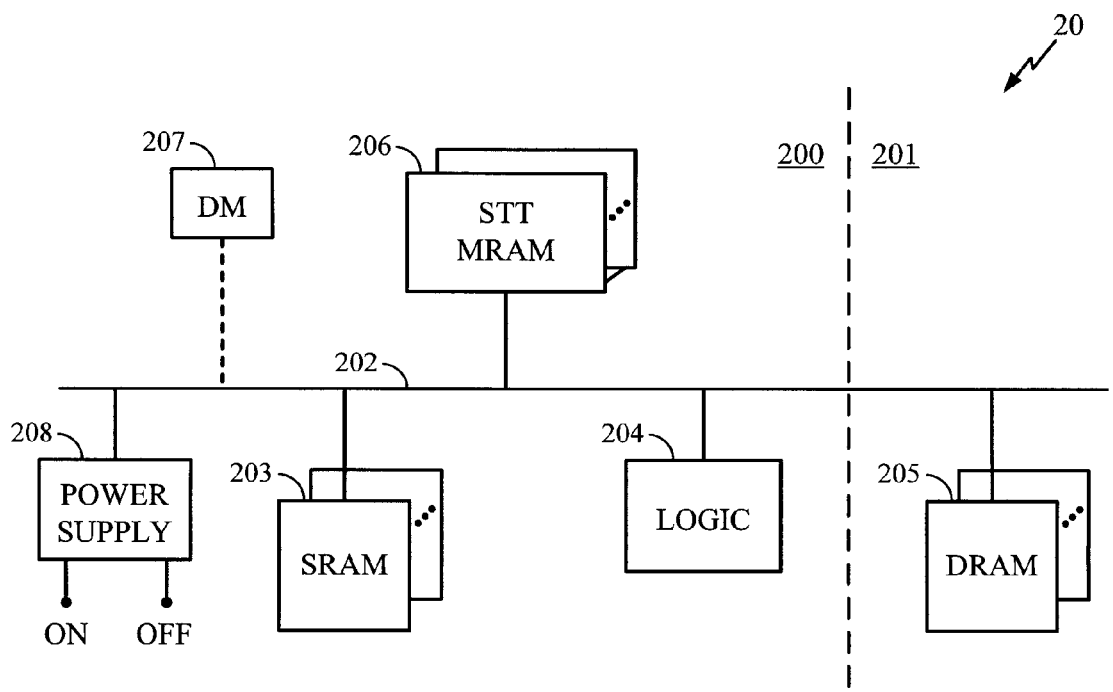
FIG. 2, a block diagram illustrating of an electronic system configured in accordance with the teachings of the present disclosure.

Turning now to FIG. 2, a block diagram is illustrated of an electronic system 20 configured according to one embodiment of the present disclosure. The electronic system 20 has an internal section 200, in which processing operations internal to the functionality of the electronic system 20 or a particular feature are performed, and an external section 201, which is connected to the internal section 200 and provides various functionalities, such as input/output (I/O), longer term random access storage, such as the DRAM block 205, and the like, which are performed or intended to be performed external to the internal section 200. The electronic system 20 may have several internal sections or functional blocks, such as the internal section 200, providing various features and functionalities.

Figure 1:
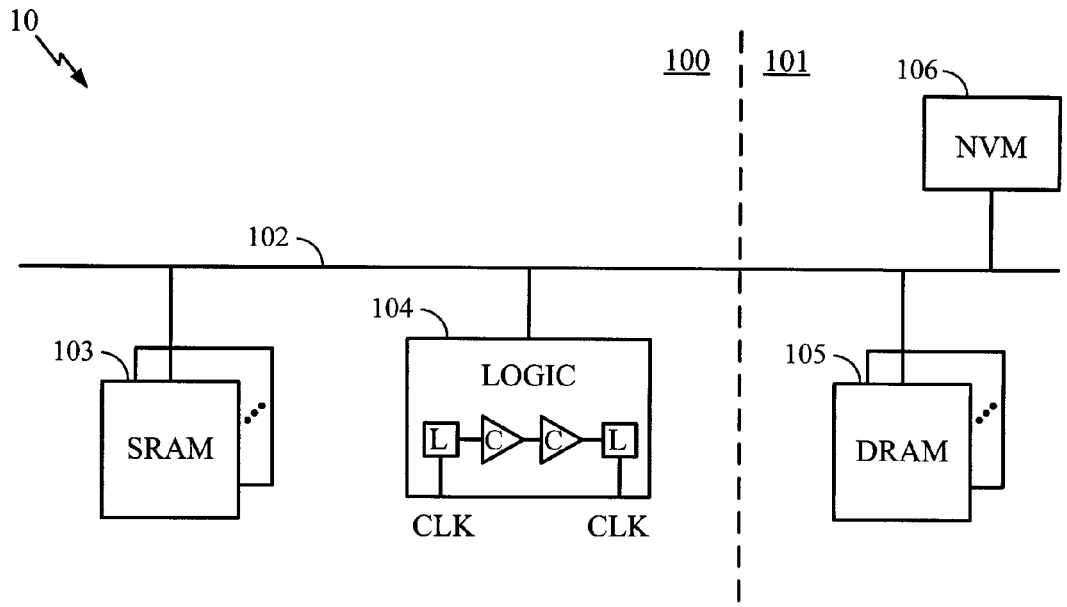
FIG. 1 is a block diagram illustrating an electronic system featuring a conventional memory configuration using a flash non-volatile memory.

The electronic system 20 also provides for a spin torque transfer (STT) magnetic random access memory (MRAM) block 206 which provides an internal non-volatile memory. The STT MRAM block 206 uses magnetic polarity and not charge storage to maintain its memory. Therefore, when the power supply 208 is disconnected from the STT MRAM block 206, the memory state is retained because the magnetic polarity is maintained without reliance on power or electrical charge or current from power supply 208. Thus, when the internal section 200 enters into the standby state, the state information from the SRAM 203 and logic 204 is stored in the STT MRAM block 206. Moreover, because the STT MRAM block 206 is within the internal section 200, the amount of power consumed in transferring the data over the bus 202 is less than that consumed with regard to the electronic system 10 (FIG. 1). The STT MRAM block 206 also reads and writes much faster than external non-volatile memory, such as a hard drive or flash memory, e.g., the flash NVM 106 of the electronic system 10 (FIG. 1). Therefore, still more power is saved because the amount of time it takes to write the information to the STT MRAM block 206 is much less.

Once the state information has been transferred into the STT MRAM block 206, all or substantially all of the power from the power supply 208 can be removed from the internal section 200, because the STT MRAM block 206 does not need power in order to maintain its data. When the internal section 200 powers back up, the power supply 208 is restored and the state information is re-loaded from the STT MRAM block 206 back into the SRAM 203 and logic 204. Again, because of the shorter distance to travel on the bus 202 and the greater speed with which the STT MRAM block 206 reads and writes data, the state information is quickly loaded back into the SRAM 203 and logic 204 such that processing of the application can continue in what appears to the user to be a much more instantaneous manner and having conserved a considerable amount of power during the standby state.

In operation, the electronic system 20 is a mobile phone. The internal section 200 is the multimedia section of the mobile phone. When a call comes into the mobile phone while the user is working in the multimedia section, that section is power-collapsed by turning the power supply 208 off to the internal section 200 and is placed into a standby mode while the user answers the call. The telephony functionality facilitating the user's phone call would then be implemented by another internal section (not shown) of the electronic system 20. When the call is completed and the user wants to return to his or her work in the multimedia section, the internal section 200 is powered up by restoring the power supply 208, as noted above. During its standby period, however, virtually no power leakage or consumption occurs within the internal section 200 because power is not required during the standby state for the STT MRAM block 206 to maintain the state information with regard to the multimedia processing.

In an additional and/or alternative embodiment of the present disclosure, a data mover block 207 is added to the internal section 200. The data mover block 207 is specifically tasked with moving the data from the SRAM 203 into the STT MRAM 206. The data mover block 207 includes a list of addresses which are sequenced through when moving the data from the SRAM 203 to the STT MRAM 206 and back again. Inclusion of the data mover block 207 allows the transfer of the data to occur more rapidly.

Figure 3:
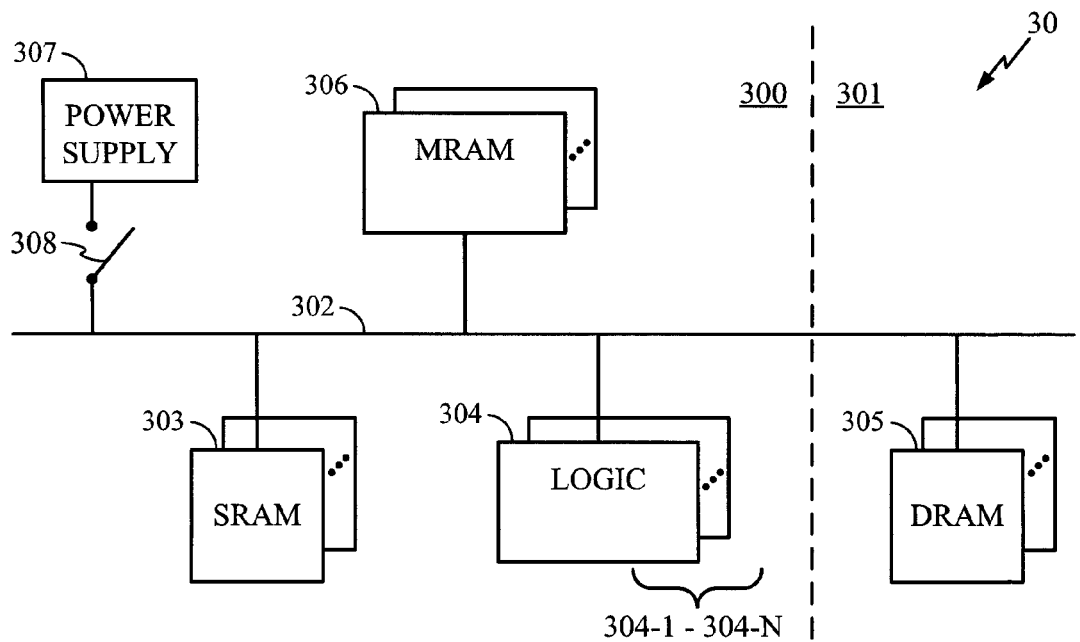
FIG. 3 is a block diagram illustrating another electronic system configured in accordance with the teachings of the present disclosure.

FIG. 3 is a block diagram illustrating an electronic system 30 configured according to one embodiment of the present disclosure. In the illustrated embodiment, the electronic system 30 comprises a digital media player. The electronic system 30 is similar to the electronic system 20 (FIG. 2), including an internal section 300, an external section 301, and a bus 302 coupling each of the system components. The internal section 300 includes an SRAM block 303 and an MRAM block 306. The external section 301 includes a DRAM block 305. The electronic system 30 also includes a multi-core logic 304. The multi-core logic 304 includes multiple logic cores, 304-1 to 304-N that handle parallel or cooperative processing of data for the electronic system 30. The internal section 300 is powered by a power supply 307 which is coupled to the internal section 300 through a switch 308.

As the internal section 300 is powered down into a standby state the state information residing within the SRAM 303 and multi-core logic 304 is quickly stored within the MRAM block 306. In operation, any particular blocks with MRAM block 306 may be associated with a particular one of logic cores 304-1 to 304-N. Again, because of the speed with which the MRAM elements of the MRAM block 306 read and write data, and the shorter bus length of the bus 302 that the state information travels between the SRAM 303/multi-core logic 304 and MRAM block 306, a lesser amount of power is consumed in storing the state of the internal section 300 than in the electronic system 10 (FIG. 1). Once the state is stored, the power supply 307 can then be removed from the internal section 300 by opening the switch 308 during the standby state. Thus, virtually no power leakage or consumption occurs during standby. When the internal section 300 wakes up from standby, the switch 308 is again closed, restoring the power from the power supply 307. The reverse process restores the state information to the SRAM 303 and the multi-core logic 304 and the internal section 300 continues processing at the same point as when it entered standby.

The embodiments illustrated in FIGS. 2 and 3 have shown use of nonvolatile magnetic memory in separate components coupled together in the same internal section. However, additional and/or alternative embodiments of the present disclosure provide that the nonvolatile magnetic memories can be integrated into the same silicon substrate as the logic cores.

Figure 4:
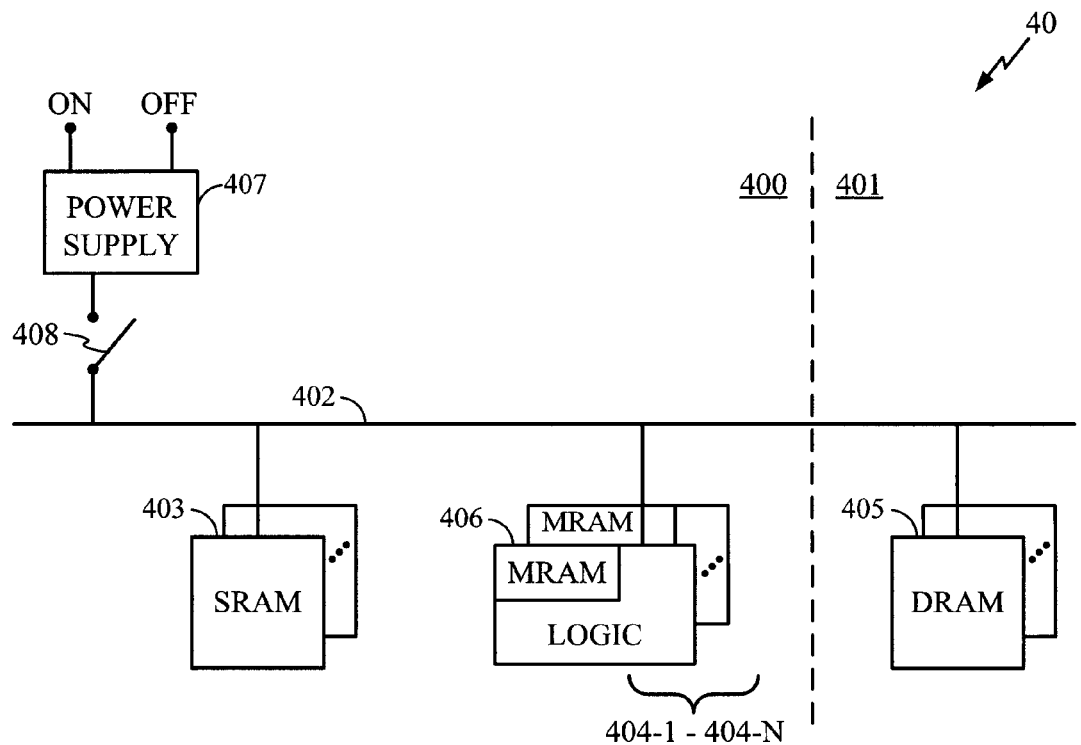
FIG. 4 is a block diagram illustrating a further electronic system configured in accordance with the teachings of the present disclosure.

FIG. 4 is a block diagram illustrating an electronic system 40 configured according to one embodiment of the present disclosure. In the illustrated embodiment, the electronic system 40 is a desktop computer. The electronic system 40 includes an internal section 400 and an external section 401. The external section 401 includes a DRAM block 405. The internal section 400 includes an SRAM block 403 and a multi-core logic 404 and is powered by a power supply 407 coupled to the internal section 400 via a switch 408. The multi-core logic 404 includes an embedded MRAM 406 in each of the logic cores 404-1 to 404-N. Because of the desirable scalability and compatibility with existing chip technology, the MRAM 406 can be embedded directly into the silicon substrate of the multi-core logic 404 with the addition of as little as two masks. In contrast, embedding flash memory into a logic core silicon substrate generally uses as many as ten or more additional masks than the number of masks conventionally used to manufacture the other logic. In one embodiment, the embedded MRAM 406 is shared among some of the logical cores 404-1 to 404-N, and only actually embedded in some of those logical cores 404-1 to 404-N.

With the embedded MRAM 406, the power consumed in transferring the state information is much less than having to transfer it all over the bus 402. Moreover, because the embedded MRAM 406 is on-chip, the number of I/O paths are not limited as when moving between components off-chip. Thus, the delay in transferring the data is reduced because the bandwidth of the on-chip bus is much higher than bus 402. When the internal section 400 enters a standby state, the data making up the current operational state is saved onto the embedded MRAM 406 and the power supply 407 is shut off and isolated from internal section 400 by opening the switch 408. As the internal section 400 wakes up, the switch 408 is closed and the power supply 407 is turned on, powering up the components of the internal section 400. The data for the current operational state is then reinstituted to the SRAM 403 block and the multi-core logic 404. Power consumption and time for the reading and writing processes are, therefore, greatly reduced.

Figure 5:
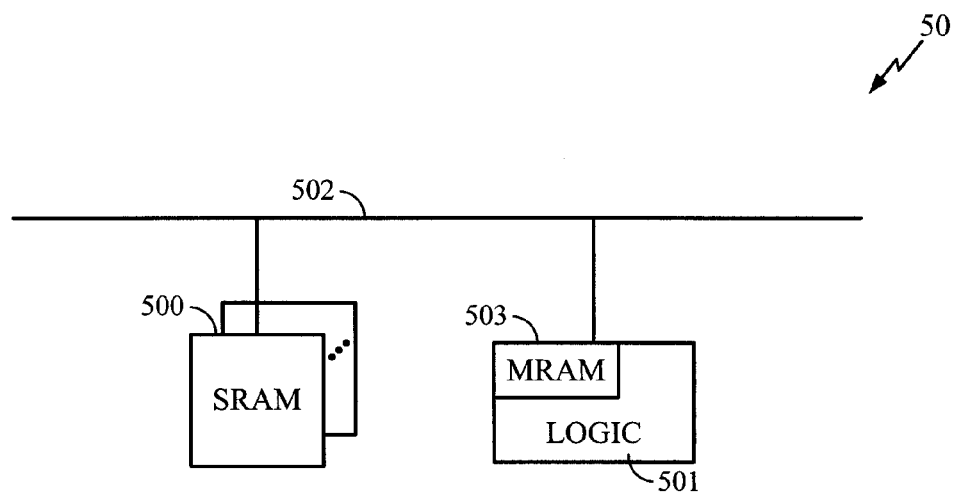
FIG. 5 is a block diagram illustrating a still further electronic system configured in accordance with the teachings of the present disclosure.

FIG. 5 is a block diagram illustrating an electronic system 50 configured according to one embodiment of the present disclosure. The electronic system 50 is configured having a single-core logic 501 coupled with a SRAM block 500 over a bus 502. Similar to the multi-core logic 404 (FIG. 4), an MRAM block 503 is embedded directly into the silicon substrate of the single-core logic 501. The embedding of the MRAM 503 within the single-core logic 501 provides a beneficial relationship, as described with respect to the multi-core logic 404 (FIG. 4). Processing time and power are conserved because of the increased I/O bandwidth and the resulting increased efficiency in on-chip data transmission. When the electronic system 50 enters the standby state, the power may be completely removed from the electronic system 50 and the state will still be retained in the MRAM 503.

When the MRAM components are embedded into a substrate of the underlying logic circuitry, the MRAM configuration is designed with respect to the underlying logic configuration in order to facilitate the embedding. MRAM blocks that are fabricated within their own chips can be designed specifically to optimize the operation of the MRAM components. Thus, while directly embedding MRAM into the silicon substrate of logic components will increase the speed and efficiency of any data transfer, an MRAM-only chip may be designed that reads and writes much faster and more efficiently than the embedded MRAM. Each such embodiment will have its own benefits depending on the desired operation of the system designer. In one embodiment, both embedded MRAM and stand alone MRAM blocks (such as FIG. 3) attached via bus are provided to achieve the benefits of both configurations.

Figure 6:
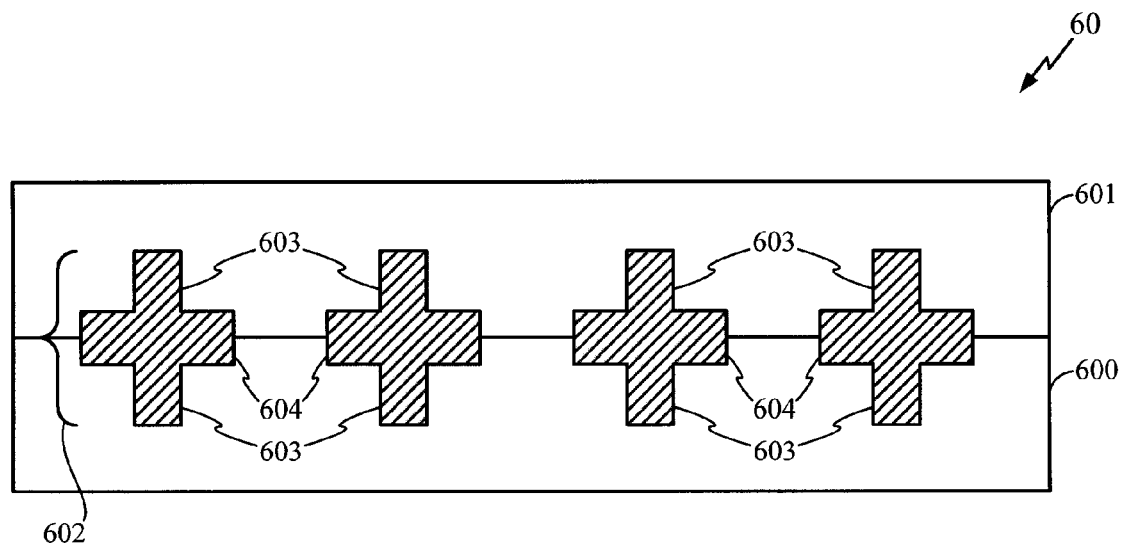
FIG. 6 is a schematic diagram illustrating a side view of an electronic system configured in accordance with the teachings of the present disclosure.

FIG. 6 is a schematic diagram illustrating a side view of an electronic system 60 configured according to one embodiment of the present disclosure. The electronic component 60 is an integrated circuit including an MRAM chip 601 stacked on top of a logic chip 600. The MRAM chip 601 is connected to the logic chip 600 through a series of interchip connectors 602, which comprise through silicon vias (TSVs) 603 and connector pads 604 in the depicted embodiment. The TSVs 603 allow signals to be transmitted directly from the logic chip 600 to the MRAM chip 601. In another embodiment (not shown) the MRAM and logic chips stacked within a package are interconnected using wire bonds, instead of TSVs. In both embodiments, the power savings is greatly increased over the transmission power consumption exhibited in the electronic system 10 of FIG. 1 transmitting data over the bus 102. As described with respect to FIGS. 2-5, the MRAM chip 601 is able to save its information and maintain that information even when power is removed. Thus, the operation of the electronic system 60 provides for stable non-volatile storage of information from the logic chip 600.

The stacked-chip configuration of the electronic component 60 provides operation similar to the combined operation of MRAM and logic cores described in FIGS. 2-5. In fact, in order to create additional and/or alternative embodiments, the electronic component 60 may be substituted for other MRAM-logic configurations. For example, the electronic component 60 may be substituted for the logic 204 and STT MRAM 206 of FIG. 2; it may be substituted for each of the MRAM blocks 306 and each of the logic cores 304-1 to 304-N of FIG. 3; it may be substituted for each of the logic cores 404-1 to 404-N and the embedded MRAM blocks 406 of FIG. 4; and it may be substituted for the logic 501 and the embedded MRAM 503 of FIG. 5. The various embodiments of the present disclosure are, thus, not limited to any particular configuration of MRAM blocks with regard to the particular electronic systems.

Figure 7:
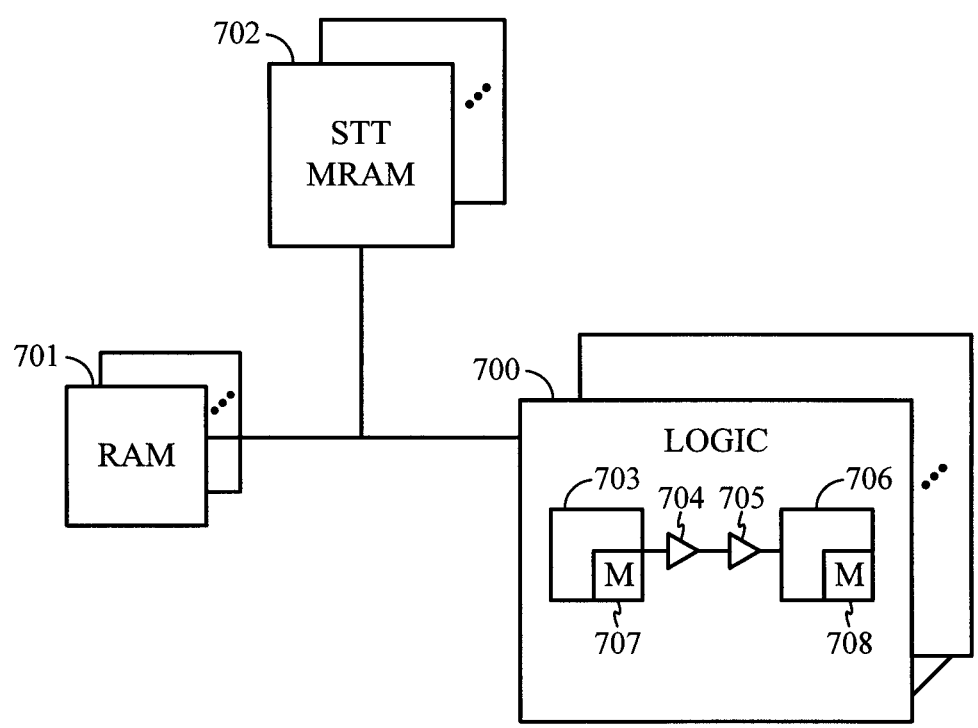
FIG. 7 is a block diagram illustrating an electronic system configured in accordance with the teachings of the present disclosure.

Turning now to FIG. 7, FIG. 7 is a block diagram illustrating an electronic system 70 configured according to one embodiment of the present disclosure. The electronic system 70 is a multi-core logic block 700, a RAM block 701, and an STT MRAM block 702. In the embodiment of the electronic system 70 depicted in FIG, 7, the STT MRAM block 702 is used only to store state information for the RAM block 701. The state information in the multi-core logic block 700 is stored within non-volatile memory within each of latches 703 and 706. The technology underlying this non-volatile memory latch storage is described in greater detail in commonly-assigned, co-pending, patent application Ser. No. 12/328,042 entitled, "NON-VOLATILE STATE RETENTION LATCH,"the disclosure of which is hereby incorporated herein by reference in its entirety.

The multi-core logic block 700 includes latches 703 and 706 coupled with combinational logic blocks 704 and 705. By using the nonvolatile magnetic memory configurations described in the incorporated patent application, for the non-volatile memories 707 and 708, both the state information contained within the RAM block 701 and the state information contained within the multi-core logic block 700 can be stored and maintained while power is removed from the electronic system 70. Thus, the electronic system 70 may enter into a power-saving standby state while still maintaining the state information for an instant-on when the user decides to wake up the system. Therefore, little to no power is consumed or leaked while electronic system 70 is in standby mode because no power is required by the STT MRAM block 702 or the nonvolatile memories 707 and 708 within multi-core logic blocks 700.

Figure 8:
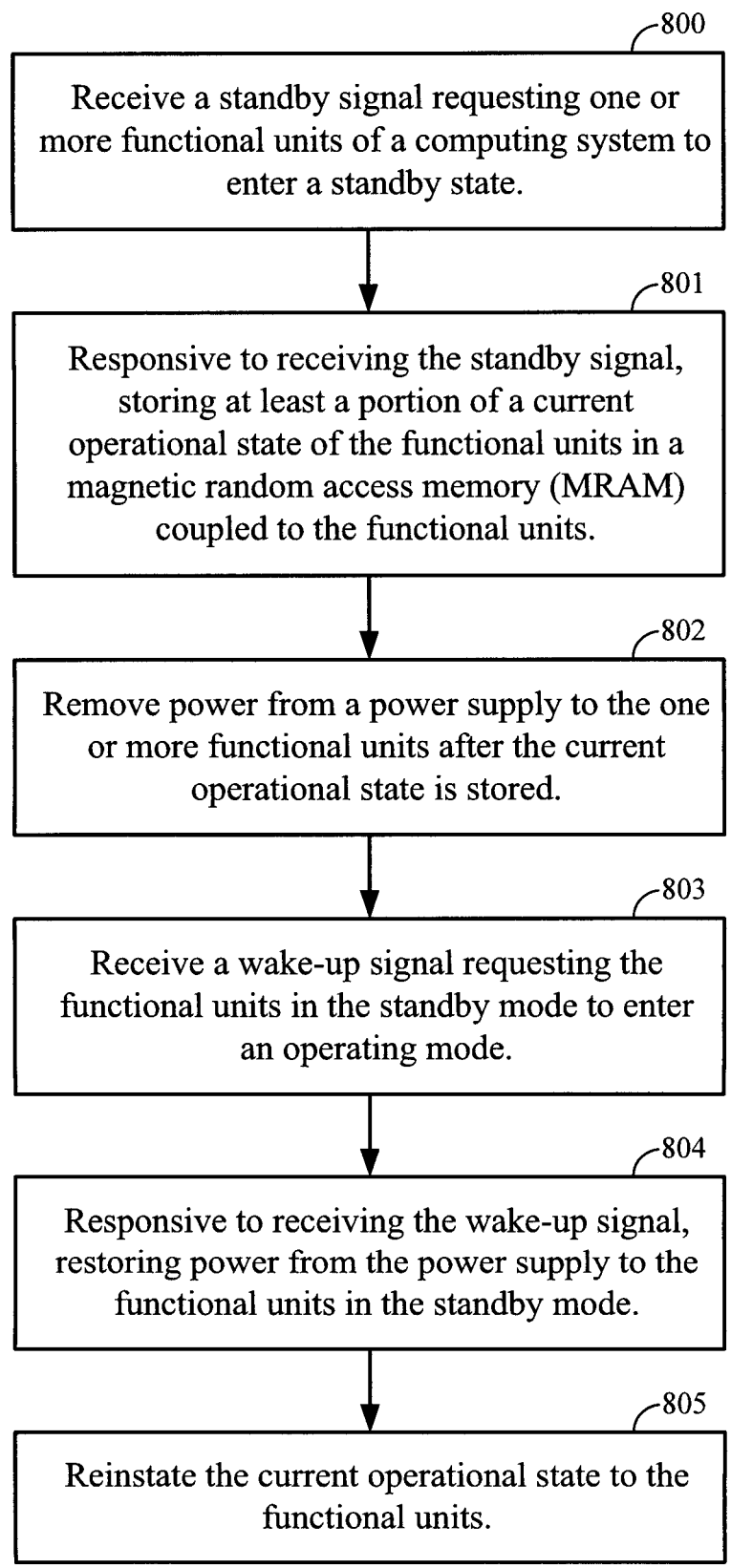
FIG. 8 is a flow chart illustrating example blocks executed to implement various embodiments in accordance with the teachings of this disclosure.

FIG. 8 is a flowchart illustrating example blocks executed to implement one embodiment of the present disclosure. In block 800, a standby signal is received requesting one or more functional units of a computing system to enter a standby state. A functional unit is a set of registers and combinational logic that performs a basic function. For example, functional units include integer units, multimedia units (e.g., a video audio CODEC), etc. Responsive to receiving the standby signal, at least a portion of a current operational state of the functional units is stored, in block 801, in a magnetic random access memory (MRAM) coupled to the functional units. Power is removed, in block 802, from the one or more functional units after the current operational state is stored. A wake-up signal is received, in block 803, requesting the functional units in the standby mode to enter an operating mode. Responsive to receiving the wake-up signal, power is restored, in block 804, from the power supply to the functional units in the standby mode. The current operational state is reinstated in block 805 to the functional units.

It should be noted that while the illustrated embodiments of the present disclosure have been identified as a mobile phone, digital media player, and desktop computer, the various embodiments are not limited to these implementations. The present disclosure may take the form or any number of electronic systems that process something and has a processing state that may be maintained.

For purposes of this disclosure an MRAM block is considered a storage element in which data is not stored as electric charge or current flows, but by magnetic storage elements. The magnetic elements are generally formed from two ferromagnetic plates, each of which can hold a magnetic field, separated by a thin insulating layer. In one embodiment, one of the two plates is a permanent magnet set to a particular polarity. The magnetic field of the other plate can be configured to change to match that of an external field. An MRAM block is built from a grid of such "cells".

Whereas some embodiments presented herein are described with respect to magnetic random access memory, and more particularly spin torque transfer (STT) magnetic random access memory, the features described can be contemplated as being applied as well to such devices including phase-change random access memory (PCRAM), resistance-based random access memory (R-RAM), or any device that can store a resistance-based electrically programmable memory state in a non-volatile manner, i.e., in the absence of sustaining power, which is reprogrammable to a plurality of states, whether by electrical, magnetic, electromagnetic (e.g., optical), or a combination of such physical effects.

Although the present invention and its advantages have been described in detail, it should be understood that various changes, substitutions and alterations can be made herein without departing from the spirit and scope of the invention as defined by the appended claims. For example, although the preceding description has discussed replacing certain types of memory, such as the DRAM or non-volatile RAM, the disclosure is not limited to such embodiments. Rather, portions of each type of memory can remain as needed, with the MRAM only replacing certain portions of each type of memory. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A computing system comprising:
   an internal section;
   an external section coupled to the internal section;
   at least one functional unit within the internal section;
   a magnetoresistive random access memory (MRAM) block within the internal section and embedded in a substrate of the at least one functional unit, the MRAM block configured to store a functional state of the at least one functional unit during a standby state of the internal section; and
   a volatile memory within the external section.

2. The computing system of claim 1 further comprising:
   a random access memory (RAM) block coupled to the at least one functional unit and the MRAM block, wherein the RAM block is configured to store a portion of the functional state of the at least one functional unit during a power on state of the at least on functional unit, and wherein the MRAM block is further configured to store the portion during the power down state.

3. The computing system of claim 2 further comprising:
   a data mover block configured to transfer the portion of the functional state located in the RAM into the MRAM block during the power down state.

4. The computer system of claim 1 wherein the MRAM block is a spin torque transfer (STT) MRAM block.

5. The computing system of claim 1 wherein the functional state comprises a plurality of data representing the functional state of the at least one functional unit.

6. The computing system of claim 1 wherein the MRAM block comprises an STT MRAM chip and the at least one functional unit comprises at least one functional unit chip.

7. A method comprising:
   receiving a standby signal within a computing system including an internal section, and an external section coupled to the internal section, the standby signal requesting the internal section, including one or more functional units, to enter a standby state during operation of the external section;
   responsive to receiving the standby signal, storing a first portion of a current operational state from the one or more functional units in a magnetic random access memory (MRAM) embedded in a substrate of the one or more functional units, and storing, in the MRAM, a second portion of the current operational state from the internal section; and
   removing power from the internal section including the one or more functional units after the current operational state is stored.

8. The method of claim 7 further comprising:
   receiving a wake-up signal requesting the one or more functional units in the standby mode to enter an operating mode;
   responsive to receiving the wake-up signal, restoring the power to the one or more functional units in the standby mode; and
   reinstating the current operational state to the one or more functional units.

9. The method of claim 7 wherein the storing comprises:
   scanning the one or more functional units for data defining the first portion of the current operational state;
   transmitting the data defining the first portion of the current operational state from the one or more functional units to the MRAM; and
   transferring additional data defining the second portion of the current operational state from a random access memory (RAM) coupled to the one or more functional units to the MRAM.

10. The method of claim 9 further comprising:
    receiving a wake-up signal requesting the one or more functional units in the standby mode to enter an operating mode;
    in response to the wake-up signal, restoring the power to the one or more functional units in the standby mode;
    loading the data defining the first portion of the current operational state from the MRAM into another portion of the one or more functional units; and
    reinstating the additional data defining the second portion of the current operational state from the MRAM into the RAM.

11. The method of claim 7 wherein the storing comprises:
    storing data defining the first portion of the current operational state of the one or more functional units in one or more magnetic memories associated with one or more latches in a processing path of the one or more functional units; and
    transferring additional data defining the second portion of the current operational state from a random access memory (RAM) coupled to the one or more functional units to the MRAM.

12. The method of claim 11 further comprising:
    receiving a wake-up signal requesting the one or more functional units in the standby mode to enter an operating mode;
    in response to the wake-up signal, restoring the power from the power supply to the one or more functional units in the standby mode;
    loading the data defining the first portion of the current operational state from the one or more magnetic memories into the one or more functional units; and
    reinstating the additional data defining the second portion of the current operational state from the MRAM into the RAM.

13. The method of claim 7 wherein the removing the power comprises one or both of:
    switching off a power supply coupled to the one or more functional units; and
    creating an open circuit between the power supply and the one or more functional units.

14. A system comprising:
    means for receiving a standby signal within a computing system including an internal section and an external section coupled to the internal section, the standby signal requesting the internal section, including one or more functional units, to enter a standby state during operation of the external section;
    responsive to the standby signal, means for storing a first portion of a current operational state of the one or more functional units in a magnetic random access memory (MRAM) embedded in a substrate of the one or more functional units, and means for storing, in the MRAM, a second portion of the current operational state from the internal section;

means for removing power from the internal section, including the one or more functional units after the current operational state is stored;

means for receiving a wake-up signal requesting the one or more functional units in the standby mode to enter an operating mode;

responsive to the wake-up signal, means for restoring the power to the one or more functional units in the standby mode; and means for reinstating the current operational state to the one or more functional units.

15. The system of claim 14 wherein the means for storing comprises:

means for scanning the one or more functional units for data defining the first portion of the current operational state;

means for transmitting the data defining the first portion of the current operational state from at least one section of the one or more functional units to the MRAM; and means for transferring additional data defining the second portion of the current operational state from a random access memory (RAM) coupled to the one or more functional units to the MRAM.

16. The system of claim 15 further comprising:

means for loading the data defining the first portion of the current operational state from the MRAM into the one or more functional units; and means for reinstating the additional data defining the second portion of the current operational state from the MRAM into the RAM.

17. The system of claim 14 wherein the means for storing comprises:

means for storing data defining the first portion of the current operational state located in the one or more functional units in one or more magnetic memories associated with one or more latches; and means for transferring additional data defining the second portion of the current operational state from a random access memory (RAM) coupled to the one or more functional units to the MRAM.

18. The system of claim 17 further comprising:

means for loading the data defining the first portion of the current operational state from the one or more magnetic memories into the one or more functional units; and means for reinstating the additional data defining the second portion of the current operational state from the MRAM into the RAM.

19. The system of claim 14 wherein the means for removing the power comprises one or both of:

means for switching off a power supply coupled to the one or more functional units; and means for creating an open circuit between the power supply and the one or more functional units.

20. A computing system comprising:

an internal section;

an external section coupled to the internal section;

at least one functional unit within the internal section;

means for placing the internal section into a standby state during operation of the external section; and means for storing a functional state of the at least one functional unit, prior to placing the internal section into the standby state, during operation of the external section, the storing means within the internal section and embedded in a substrate of the at least one functional unit.

* * * * *